(12) United States Patent
Nagaishi et al.

(10) Patent No.: US 10,756,426 B2
(45) Date of Patent: Aug. 25, 2020

(54) MILLIMETER-WAVE BAND COMMUNICATION DEVICE

(71) Applicant: HITACHI AUTOMOTIVE SYSTEMS, LTD., Hitachinaka-shi, Ibaraki (JP)

(72) Inventors: Hideyuki Nagaishi, Tokyo (JP); Akira Kuriyama, Tokyo (JP); Takafumi Matsumura, Hitachinaka (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 69 days.

(21) Appl. No.: 16/308,320

(22) PCT Filed: Apr. 13, 2017

(86) PCT No.: PCT/JP2017/015124
§ 371 (c)(1),
(2) Date: Dec. 7, 2018

(87) PCT Pub. No.: WO2017/217098
PCT Pub. Date: Dec. 21, 2017

(65) Prior Publication Data
US 2019/0190142 A1 Jun. 20, 2019

(30) Foreign Application Priority Data
Jun. 14, 2016 (JP) ................... 2016-117506

(51) Int. Cl.
*H01Q 1/38* (2006.01)
*H01Q 1/42* (2006.01)
(Continued)

(52) U.S. Cl.
CPC ............. *H01Q 1/526* (2013.01); *H01P 3/08* (2013.01); *H01P 5/08* (2013.01); *H01P 5/107* (2013.01);
(Continued)

(58) Field of Classification Search
CPC ... H01P 3/08; H01P 5/08; H01P 5/107; H01Q 13/02; H01Q 13/08; H01Q 19/06;
(Continued)

(56) References Cited

U.S. PATENT DOCUMENTS 6,317,095 B1 * 11/2001 Teshirogi ................. H01Q 3/24
343/770
6,320,543 B1 * 11/2001 Ohata ................... H01Q 9/0407
343/700 MS
(Continued)

FOREIGN PATENT DOCUMENTS

JP    56-111511 U    8/1981
JP    05-004592 U    1/1993
(Continued)

OTHER PUBLICATIONS

International Search Report dated Jun. 20, 2017 for the International Application No. PCT/JP2017/015124.

*Primary Examiner* — Tho G Phan
(74) *Attorney, Agent, or Firm* — Volpe and Koenig, P.C.

(57) ABSTRACT

Proposed is a millimeter-wave band communication device which does not generate spatial resonance in a cover shielding unnecessary radio waves from the outside.
Disclosed is a millimeter-wave band communication device including: a substrate; a radio frequency circuit element for a millimeter-wave band provided on the substrate; and a cover made of a bulk material that covers at least a part of the radio frequency circuit element and a surface of the substrate, the cover being formed by blending a dielectric loss material in a base.

16 Claims, 5 Drawing Sheets

(51) Int. Cl.
*H01Q 1/52* (2006.01)
*H01Q 13/02* (2006.01)
*H01Q 19/06* (2006.01)
*H01P 3/08* (2006.01)
*H01Q 23/00* (2006.01)
*H01Q 13/08* (2006.01)
*H01P 5/08* (2006.01)
*H01P 5/107* (2006.01)
*H05K 9/00* (2006.01)

(52) U.S. Cl.
CPC .............. *H01Q 1/42* (2013.01); *H01Q 13/02* (2013.01); *H01Q 13/08* (2013.01); *H01Q 19/06* (2013.01); *H01Q 23/00* (2013.01); *H05K 9/00* (2013.01)

(58) Field of Classification Search
CPC .. H01Q 1/38; H01Q 1/42; H01Q 1/52; H01Q 1/526; H01Q 23/00; H05K 9/00
See application file for complete search history.

(56) References Cited

U.S. PATENT DOCUMENTS

| | | | |
|---|---|---|---|
| 6,337,661 B1* | 1/2002 | Kondoh | H01L 23/552 257/E23.114 |
| 6,388,623 B1* | 5/2002 | Sakota | H01Q 1/3233 257/672 |
| 6,410,847 B1 | 6/2002 | Allen et al. | |
| 6,518,932 B1* | 2/2003 | Matsui | H01Q 1/42 343/700 MS |
| 8,564,477 B2* | 10/2013 | Sagala | G01S 7/032 342/104 |
| 8,629,813 B2* | 1/2014 | Milosavljevic | H01Q 1/243 343/850 |
| 2002/0067313 A1 | 6/2002 | Kondoh et al. | |
| 2007/0159380 A1* | 7/2007 | Nagaishi | G01S 13/931 342/70 |
| 2010/0026598 A1 | 2/2010 | Yokoi et al. | |
| 2014/0204550 A1 | 7/2014 | Kataoka et al. | |

FOREIGN PATENT DOCUMENTS

| | | |
|---|---|---|
| JP | 2000-307305 A | 11/2000 |
| JP | 2001-057507 A | 2/2001 |
| JP | 2002-124592 A | 4/2002 |
| JP | 2002-134987 A | 5/2002 |
| JP | 2003-273569 A | 9/2003 |
| JP | 2008-252634 A | 10/2008 |
| JP | 2009-010458 A | 1/2009 |
| JP | 2014-143250 A | 8/2014 |
| JP | 2015-119295 A | 6/2015 |

* cited by examiner

MILLIMETER-WAVE BAND COMMUNICATION DEVICE

TECHNICAL FIELD

The present invention relates to a communication device and a sensor device which utilize a millimeter wave electromagnetic wave.

BACKGROUND ART

Devices using millimeter-wave band frequencies are expected to be applied to a backbone line device between radio base stations due to broadband nature and applied to a sensing device such as a radar due to sharp rectilinearity. Recent millimeter wave semiconductor devices are supplied to the market in the form of a surface-mount terminal such as a ball grid array in a state where a transmission circuit or a reception circuit, or both the functions are integrated in one package. Accordingly, products using these devices are premised on the use of a component mounter and a reflow furnace, and a low-cost assembly is also realized in products intended for a millimeter-wave band.

A millimeter wave semiconductor device used in a millimeter wave radar is a device with a wide signal dynamic range and high sensitivity. Factors of a malfunction of the semiconductor device include interference of unnecessary radio waves from the outside and a shield case using a metallic cover is used as a measure for suppressing unnecessary radio waves as disclosed in PTLs 1 to 4.

CITATION LIST

Patent Literature

PTL 1: JP 2015-119295 A
PTL 2: JP 2000-307305 A
PTL 3: JP 2002-134987 A
PTL 4: JP 2002-124592 B2

SUMMARY OF INVENTION

Technical Problem

Millimeter-wave band communication devices illustrated in the background art use the metallic cover (shield case) as the measure for suppressing unnecessary radio waves from the outside world. The shield case reflects radio waves using an effect (secondary radiation) of radiation of the radio waves due to a high conductivity of metal. The high reflection efficiency of metal indicates that spatial resonance of radio waves is likely to occur within the case, and there is a possibility that a reception circuit or an oscillator may be adversely affected by radio waves radiation-leaking from a millimeter-wave band circuit itself.

In PTL 1, a space size of the shield case is set such that a resonance frequency avoids a use frequency. PTL 2 uses a band-stop filter in a periodic structure of metallic protrusions provided in a space. PTL 3 can suppress spatial resonance using an electromagnetic wave absorbing thermoplastic material (hereinafter abbreviated as a radio wave absorber). However, since it is difficult to achieve desired radio wave transmission characteristics by the radio wave absorber alone, a separate metal cover or a partition plate inside a case is required in order for suppression of unnecessary radio waves from the outside and isolation among a plurality of millimeter-wave band radio frequency circuits.

In PTL 4, a resistance layer is formed in a range unnecessary for an operation of the millimeter-wave band radio frequency circuit on a dielectric substrate to lower a Q value of the shield case, thereby reducing unnecessary resonance and oscillation. The radio wave absorber and a resistance film are devised such that radio waves reach a lossy material inside a medium using a low dielectric constant material having a small characteristic impedance difference with air in order to avoid a reflection on a surface of the medium.

In these cases, it is indispensable to provide a scheme for suppression of spatial resonance together with the metal cover, and there remains a problem that material cost is high. Further, if a shield structure premised on the use of the metal cover has a hole or a slit, radio waves leak, and thus, such hole and slit needs to be blocked as much as possible so that a method of sealing the metal cover is also a problem.

Solution to Problem

One aspect of the present invention is a millimeter-wave band communication device including: a substrate; a radio frequency circuit element for a millimeter-wave band provided on the substrate; and a cover made of a bulk material that covers at least a part of the radio frequency circuit element and a surface of the substrate, the cover formed by blending a dielectric loss material in a base.

Another aspect of the present invention is a millimeter-wave band communication device including: a substrate; a radio frequency circuit element provided on the substrate; and a cover covering at least a part of the radio frequency circuit element and a surface of the substrate, the cover formed by integrally molding a dielectric loss material mixed with a base in a mass ratio of between 20% and 80% and set to have a volume resistivity is 20 Ω·cm or higher and a radio wave reflection efficiency is 90% or less.

Advantageous Effects of Invention

A millimeter-wave band communication device, capable of suppressing unnecessary radio waves from the outside and reducing radiation leakage radio waves from a millimeter-wave band radio frequency circuit itself, can be realized at low cost.

DESCRIPTION OF EMBODIMENTS

Figure 1:
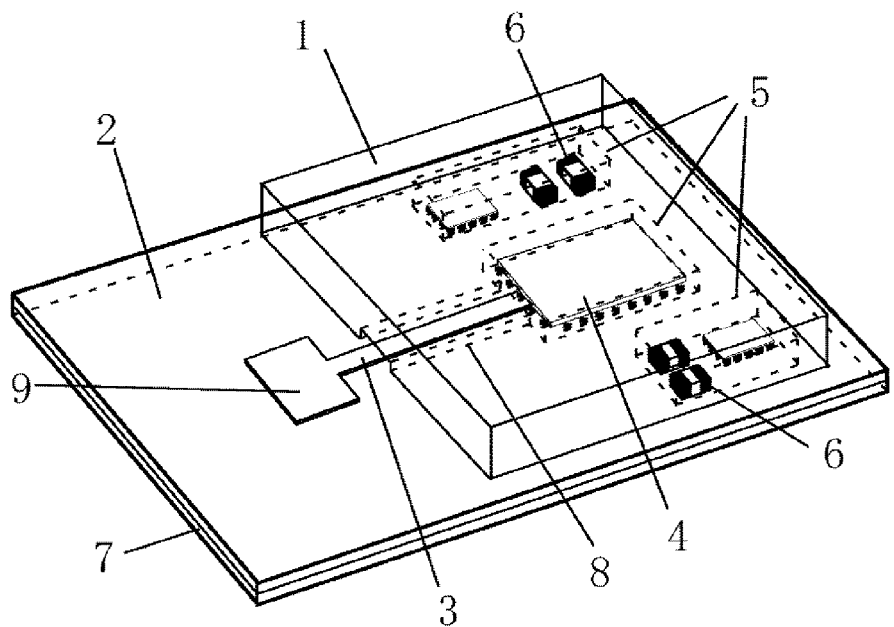
FIG. 1 is a perspective view of a millimeter-wave band communication device according to a first embodiment of the present invention.

Embodiments will be described in detail with reference to the drawings. However, the present invention is not construed as being limited to the description of the embodiments described below. Those skilled in the art can easily understand that specific configurations can be changed without departing from the spirit or gist of the present invention.

In a configuration of the invention to be described below, the same reference signs will be commonly used for the same parts or parts having similar functions in different drawings, and the redundant description thereof will be omitted in some cases.

Positions, sizes, shapes, ranges, and the like of the respective components illustrated in the drawings and the like do not always indicate actual positions, sizes, shapes, ranges and the like in order to facilitate understanding of the invention. Therefore, the present invention is not necessarily limited to the positions, sizes, shapes, ranges, and the like disclosed in the drawings and the like.

In the embodiments to be described below, a cover compounded with a dielectric loss material is used as a means for suppressing an electromagnetic wave transmission characteristic in place of a metal or metal-plated cover. As compounded with the dielectric loss material, a radio wave reflectance of the cover is set to 90% or less. When a radio wave reflection characteristics mainly depend on characteristics of a surface of the cover, a surface resistance of the cover is increased such that the radio wave reflection efficiency on the cover surface is at least 90% or less without being a metallic total reflection. It is possible to cause a loss during the reflection by lowering the reflectance of the cover, and thus, it is possible to obtain a radio wave attenuation effect by causing a reflection multiple times. The attenuation effect can be calculated by multiplying the number of reflections of the reflectance.

If the reflectance of the cover is lowered, it is necessary to increase a thickness of the cover in order to improve a transmission loss of radio waves. The increase in the thickness of the cover leads to an increase in volume and weight of a product and an increase in manufacturing cost, and thus, it is desired that the cover thickness be thin. Thus, the radio wave reflectance of the cover is desirably 50% or more.

For example, graphite powder is used as the dielectric loss material, and a shape thereof is not particularly limited, but scaly, spherical, elliptical, needle-shaped, string-shaped or amorphous powder or mixed powder of above shapes is used, and an average particle size thereof is set to, for example, 200 μm or less.

A compounding ratio of the dielectric loss material compounded in the cover is adjusted so as to obtain a desired radio wave reflection efficiency. In order to reduce the radio wave reflection efficiency of the cover to 90% or less, the compounding ratio of the dielectric loss material is set to between 20% and 80%, for example, in the entire cover or an average mass ratio, and a volume resistivity is set to 20 Ω·cm or higher on the entire cover or an average. When increasing the compounding ratio of the dielectric loss material and lowering the volume resistivity, a radio wave transmission amount decreases and the reflection efficiency increases.

When a composition of the cover is made uniform, for example, the radio wave reflection efficiency on the cover surface is set to 90% or less and the compounding ratio of the dielectric loss material is set to, for example, between 20% and 80% on the cover surface.

Regarding radio waves having been generated or entered inside the cover, an inner surface of the cover and the circuit board are configured to be close to each other in order to attenuate radio waves by multiple reflections between the cover and the circuit board.

For example, when a millimeter waveband radio frequency circuit configured using a semiconductor chip is mounted on a surface of the circuit board, a height of an outer shape of the cover configured to cover the millimeter-wave band radio frequency circuit is required to be equal to or higher than a height of the millimeter-wave band radio frequency circuit. When the cover is an integrally-formed bulk material, the over can be brought closer enough to be in close contact with the circuit board by accommodating and covering the millimeter-wave band radio frequency circuit in a concave portion by providing the concave portion (cavity) in the cover in accordance with a convex portion of the millimeter-wave band radio frequency circuit.

On the other hand, it is desirable to provide a groove such that the cover is not brought excessively close to a transmission line of a radio wave since a millimeter wave signal is attenuated only by bringing the cover compounded with the dielectric loss material close to the transmission line. The deepest portion of the groove is desirably set to be more than four times a thickness of a dielectric forming the line formed on the circuit board, and a width of the groove is desirably set to be equal to or less than a spatial wavelength λ of a use frequency.

The above-described concave portion or groove can be easily manufactured at low cost by integrally molding the cover with a resin or the like compounded with the dielectric loss material.

A metal layer, which reflects radio waves to the cover, is formed on the circuit board, and a part thereof can be used as a GND of a millimeter-wave band radio frequency circuit.

First Embodiment

<1. Overall Structure of Millimeter-Wave Band Communication Device>

FIG. 1 is a perspective view of a millimeter-wave band communication device according to a first embodiment of the present invention. Here, 1 represents a cover, 2 represents a circuit board, 3 represents a radio frequency line, 4 represents a millimeter-wave band radio frequency circuit (active element), 5 represents a cover concave portion, 6 represents a passive element, 7 is represents interlayer conductor, 8 represents a groove structure of the cover, and 9 represents an antenna. A millimeter wave generated by the millimeter-wave band radio frequency circuit 4 has a wavelength of about 4 mm at 76 GHz, for example.

The radio frequency line 3 and the antenna 9 are formed on the surface of the circuit board 2, and the interlayer conductor 7 is formed in an inner layer of the circuit board 2, and a part of a conductor layer thereof functions as a ground electrode (GND electrode) of the radio frequency line 3. The cover 1 is arranged on the surface of the circuit board 2. The GND electrode is usually configured to have an effect as a shield in order to prevent the entry of external radio waves from the circuit board 2 side. The shield functions to reflect radio waves on both sides (front and back) of the circuit board 2. The radio frequency line 3 connects the millimeter-wave band radio frequency circuit 4 and the antenna 9. With such a configuration, millimeter waves generated by the millimeter-wave band radio frequency circuit 4 are radiated from the antenna 9.

<2. Structure of Cover>

The cover 1 is made of a material in which a resin is compounded with a dielectric loss material such as graphite. For example, the cover 1 can be easily manufactured by compounding a thermoplastic resin with the dielectric loss material and injection-molding the compound. A shape of the graphite may be a scaly shape, a spherical shape, an elliptical shape, a needle shape, or a string shape. In addition, the shape may be amorphous or mixed powder of the above-described shapes. Although uniform characteristics can be obtained with a fine dielectric loss material, an average particle diameter of the dielectric loss material is set to 200 μm or less in the present embodiment in consideration of the ease of production. In the present embodiment, the compounding ratio of the dielectric loss material compounded in the cover is uniformly distributed with a mass ratio of between 20% and 80%, and a surface resistivity is set to 20Ω or higher.

When the molding is performed with the compounding ratio of graphite exceeding 80%, a volume resistivity becomes 10Ω or lower and a radio wave shielding effect of the cover increases, but the surface resistivity also decreases in proportion to the volume resistivity so that reflection efficiency on the cover surface is close to 1, and the radio waves are substantially totally reflected.

The cover close to total reflection is preferable for shielding radio waves from the outside of the cover 1, but hardly eliminates spatial resonance since almost no radio wave is attenuated during the reflection regarding the radio wave inside the cover 1 (a side on which the millimeter-wave band radio frequency circuit 4 or the like is disposed). Therefore, in the present embodiment, the attenuation when the radio wave is reflected inside the cover is increased by setting the compounding ratio of the dielectric loss material of the cover to 80% or less to intentionally suppress the reflection efficiency on the cover surface to 90% or less. Further, the elimination of the spatial resonance is achieved by multiple-reflection attenuation caused by reflecting radio waves multiple times.

In order for the multiple-reflection attenuation, it is advantageous to reduce a distance between radio wave reflecting surfaces surrounding the millimeter-wave band radio frequency circuit 4. In the example illustrated in FIG. 1, the cover 1 has a thickness T in a direction perpendicular to the circuit board 2, and a concave portion 5 is provided so as to cover a radio frequency circuit element such as the millimeter-wave band radio frequency circuit 4.

A distance D between the ceiling of the concave portion 5 of the cover 1 (a surface of the cover 1 opposing the circuit board 2) and the circuit board 2 is configured to be smaller than the thickness T in order for the multiple-reflection attenuation, and the number of reflections is increased by decreasing the distance D between the ceiling which is a reflecting surface and the substrate. When the cover 1 has a bulk shape of a substantially rectangular parallelepiped as illustrated in FIG. 1, a length and a width of the cover 1 are about 3 to 5 cm as examples of dimensions thereof. In addition, the thickness T of the cover 1 is about 2 mm, and the distance D is larger than a height H of the millimeter-wave band radio frequency circuit 4 and smaller than the thickness T.

It is desirable to use a resin or ceramics for a binder material (base) to be mixed with the graphite in the cover, and to use an insulating material such that the volume resistivity of the cover can be changed with the graphite. Various known materials such as a phenolic resin can be used for the resin serving as the binder material of the cover 1, and a manufacturing method thereof is not limited to the injection-molding.

Regarding the dielectric loss material inside the cover 1, a dielectric loss material concentration for making a cover reflection efficiency 90% or less is not necessarily uniform such as a cover whose compounding concentration is decreased as a portion is closer to the circuit board 2, a cover with a higher compounding concentration at a center portion in thickness and a lower concentration at a portion closer to the surface. It is also possible to cause a radio wave to be easily reflected outside the cover and make the radio wave to be hardly reflected inside the cover by providing a distribution in the concentration of the dielectric loss material in this manner. In addition, it is also possible to shield the radio wave inside the cover while causing the radio wave to be hardly reflected on the surface of the cover.

<3. Structure of Cover Concave Portion (Cavity)>

As described above, the cover 1 of the millimeter-wave band communication device illustrated in FIG. 1 is basically the bulk material, and has the rectangular parallelepiped shape having the predetermined thickness T in the vertical direction of the circuit board 2. As described above, the cover 1 is provided with the cover concave portion (cavity) 5 configured to dispose the millimeter-wave band radio frequency circuit 4 and the passive element 6. The surface of the circuit board 2 is uneven due to the millimeter-wave band radio frequency circuit 4 and the passive element 6 mounted on the circuit board 2, and the distance between the inner surface of the cover 1 and the circuit board 2 is shortened by fitting the convex portion of the millimeter-wave band radio frequency circuit 4 to the cover concave portion provided on the cover 1, thereby facilitating multiple reflections. In addition, the cover 1 and the circuit board 2 are brought into close contact with each other to prevent the entry of radio waves into the cavity from the outside. Since the cover 1 is integrally molded as described above, an outer surface and a back surface (a surface of the cover concave portion 5) of the cover 1 are continuous surfaces.

<4. Radio Frequency Line and Groove Structure>

A millimeter wave signal generated from the millimeter-wave band radio frequency circuit 4 is guided to the antenna 9 by the radio frequency line 3. It is desirable to provide a groove 8 such that the cover 1 is not brought excessively close to the radio frequency line 3 since the millimeter wave signal is attenuated only by bringing the cover 1 compounded with the dielectric loss material close to the radio frequency line 3. On the other hand, it is desirable to provide design such that external radio waves do not enter the cavity 5 via the groove 8 or unnecessary radio waves do not leak to the outside via the groove 8. To this end, the deepest portion of the groove 8 is desirably set to be more than four times a thickness of a dielectric forming the radio frequency line 3 formed on the circuit board 2, and a width of the groove 8 is desirably set to be equal to or less than a spatial wavelength λ of a use frequency.

Figure 2:
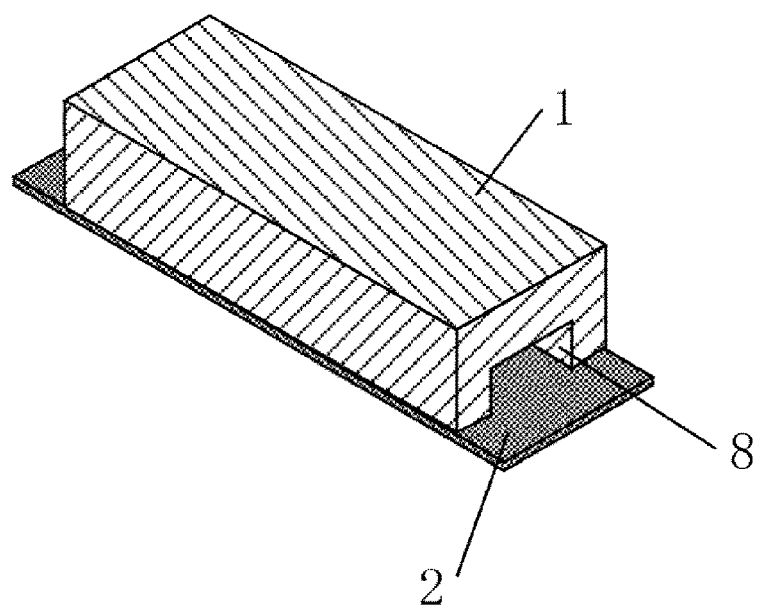
FIG. 2 is a perspective view of a groove structure of the first embodiment according to the present invention.

FIG. 2 is a schematic view illustrating the groove structure 8 provided in the cover 1 compounded with the dielectric loss material. A cross section of the groove structure 8 has a rectangular shape. In the present embodiment, a groove depth is set to be four times or more a thickness of the radio frequency line dielectric portion provided on the circuit board 2, and the groove width is set to be equal to or smaller than a wavelength size of the use frequency. Although being a rectangle in the present invention, the groove can be configured using a cross section of a circular arc, a shape obtained by cutting a part of an ellipse, a triangle, a polygon, a free-form surface, or a cross section obtained by complexly combining these shapes.

Figure 3:
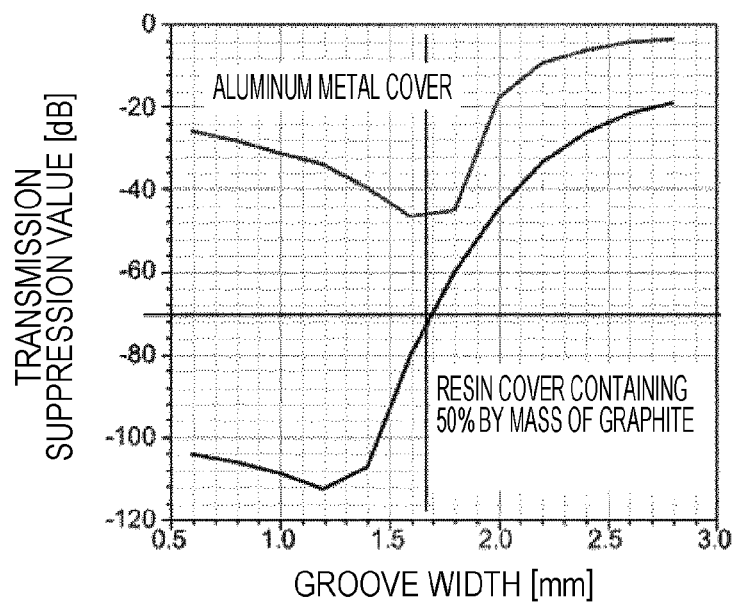
FIG. 3 is a graph of a transmission characteristic analysis result of the groove structure according to the first example of the present invention.

FIG. 3 illustrates a result of analyzing a radio wave transmission characteristic of the groove structure using an electromagnetic field simulator HFSS (a radio frequency device design tool provided by Ansoft, Inc. of USA as one of numerical electromagnetic field software). The horizontal axis represents a width of the groove structure 8, and the vertical axis represents a transmission suppression value of radio waves when the radio waves are input from the front and rear of the groove structure 8.

A cover was provided on a dielectric resin of 130 μm corresponding to the circuit board 2, and radio waves were input from the front and rear of the groove. The radio wave of 76 GHz (wavelength λ≈3.89 mm) was assumed. A cross section of the groove structure was rectangular, a depth of the groove was set to 0.8 mm, more than 4 times the dielectric thickness of 130 μm, and a width thereof was changed from 0.6 mm to 3.0 mm. A length of the groove was 8 mm. Regarding the cover to form the groove, aluminum metal (metal cover) and a resin (graphite cover) containing 50% by mass of graphite were compared as assumed materials. The cover containing 50% by mass of graphite corresponds to one having a volume resistivity of about 1MΩ, a reflection efficiency of 0.89, and a relative dielectric constant of 21 and an electrical loss of 0.34 as electrical properties. Measurement results, obtained by a transmission line method of material measurement software 85071E (trade name) manufactured by Keysight, were used.

When the aluminum metal is used for the cover, radio waves easily transmit through the groove structure, and the transmission suppression value becomes the maximum at −44 dB around a width corresponding to a cutoff frequency=1.8 mm (corresponding to λ/2) as a waveguide. Incidentally, the cutoff frequency of the metal waveguide is c/(a waveguide width*2) as well known (where c is radio speed of light). In the case of the metal cover, there is a radio wave that transmits through the inside of the resin of 130 μm forming the circuit board 2 in addition to the groove structure 8. Unless a GND conductor of the circuit board 2 and the metal cover are connected without a gap, a radio wave leakage occurs.

Regarding the metal cover, the metal compounded with graphite is subjected to multiple-reflection attenuation inside the groove structure and between the cover and the circuit board, and the signal is attenuated up to −20 dB at the width=2.8 mm, −60 dB at the width=1.8 mm, and −90 dB at the width=1.5 mm or less. From these results, it is possible to confirm that spatial radio wave propagation is significantly suppressed by the multiple-reflection attenuation when the groove width of the cover is equal to or smaller than a wavelength size and a transmission propagation amount of the cover is suppressed to −90 dB or less in the case of the cover compounded with graphite.

Figure 4:
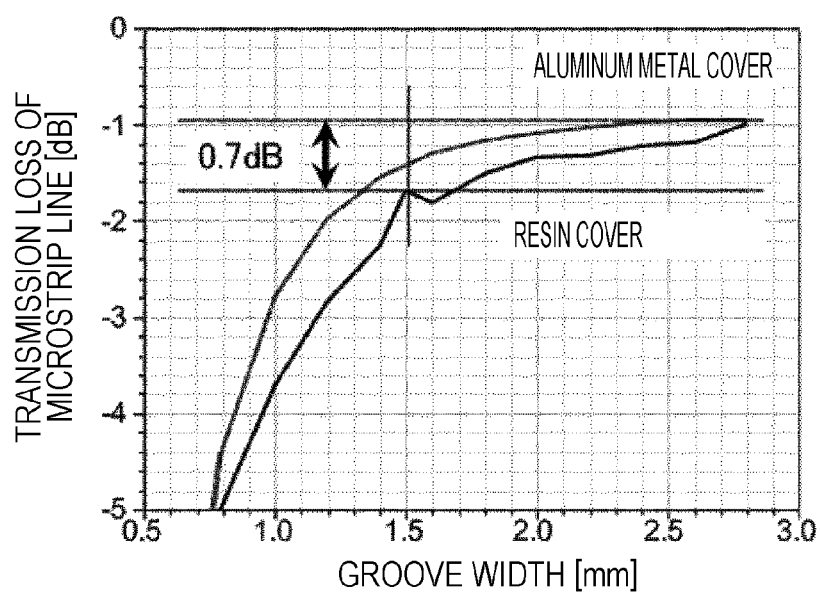
FIG. 4 is a graph of a transmission characteristic analysis result of a microstrip line provided in the groove structure according to the first example of the present invention.

FIG. 4 illustrates a result of analyzing influence of the width of the groove structure on the microstrip line obtained by providing the radio frequency line 3 (the microstrip line was used in data of FIG. 4) on the circuit board 2 in the groove structure 8 illustrated in FIG. 2. For the radio frequency line 3, a coplanar line, a ground coplanar line, or a differential line may be used other than the microstrip line. When the groove width is 3.0 mm or less, it is possible to confirm the influence of the cover groove structure that causes a result close to the microstrip line. Although a transmission loss of the microstrip line increases under the influence of the dielectric loss material, the amount of the increased transmission loss is as small as 0.7 dB at the groove width=1.5 mm. Thus, the influence of the transmission loss can be substantially ignored if the groove width is 1.5 mm or more.

When a signal of a frequency below a microwave is connected to the millimeter-wave band radio frequency circuit 4 and the passive element 6, a conductor layer disposed in an inner layer of the circuit board is used as a line to connect a surface-layer conductor of the circuit board 2 and an inner-layer conductor using a via through a GND layer of the circuit board 2. When penetrating the GND layer by the via connection, a conductor-removal pattern of less than a half size of a wavelength λ of the use frequency is provided in the GND layer.

Since the concave portion 5 and the groove structure 8 are provided in the cover 1 compounded with the dielectric loss material to be assembled with the circuit board 2 in the millimeter-wave band communication device of the present invention illustrated in FIG. 1, it is possible to suppress irradiation to the millimeter-wave band radio frequency circuit 4 using an antenna side lobe, suppress leakage radio waves emitted from the millimeter-wave band radio frequency circuit 4 itself, suppress the spatial resonance in the cover concave portion in which the millimeter-wave band radio frequency circuit 4 is accommodated, and suppress radio crosstalk from the millimeter-wave band radio frequency circuit 4 to the passive element 6 and the like while suppressing the entry of unnecessary radio waves from the outside into the millimeter-wave band radio frequency circuit 4, thereby reducing the unnecessary radio waves that induce the malfunction. Therefore, the millimeter-wave band communication device 10 enables communication making use of high-performance reception sensitivity and highly sensitive sensing by drastically reducing occurrence of unnecessary spurious or the like.

In the millimeter-wave band communication device of the present invention illustrated in FIG. 1, the cover concave portion 5 and the groove structure 8 are provided as the means for reducing the distance between the cover surface and the circuit board in order to effectively obtain the multiple-reflection attenuation by the cover 1 and the circuit board 2. However, even a resin cover having a flat cover inner surface without the cover concave portion 5 and the groove structure 8 can be practically used as long as the cover has a small radio wave suppression amount is small since the multiple-reflection attenuation using dielectric loss material can be always obtained.

Since the cover of the present invention is not a radio wave shield using metallic radiation (total reflection) but radio waves are extinguished between the cover and the circuit board using moderate multiple-reflection attenuation, there is no need to electrically connect the cover to the GND of the circuit board. Therefore, there is no need of management of a gap with the circuit board, solder brazing, processing of a conductive adhesive and the like as in the case of assembling with the metal cover, and the cover can be fixed with a simple means such as screwing, pinning, fitting stopping, pinching, and an insulating adhesive. If the cover is formed by using a molding technique with a mold, significant cost reduction is achieved regarding cost for manufacturing the cover as well as assembly cost.

Second Embodiment

Figure 5:
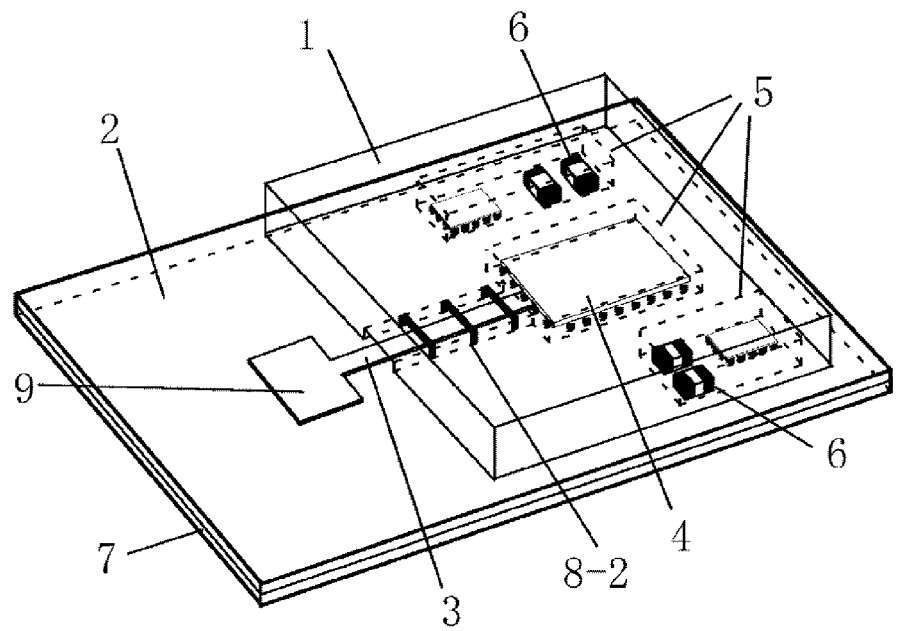
FIG. 5 is a perspective view of a millimeter-wave band communication device according to a second embodiment of the present invention.

FIG. 5 is a perspective view of a millimeter-wave band communication device according to a second embodiment of the present invention. Here, 1 represents a cover, 2 represents a circuit board, 3 represents a microstrip line, 4 represents a millimeter-wave band radio frequency circuit, 5 represents a cover concave portion, 6 represents a passive element, 7 represents an interlayer conductor, 8-2 represents a choke structure-equipped groove structure, and 9 represents an antenna.

The case with the first embodiment will be described. The groove structure 8-2 is a groove structure provided in the cover 1 compounded with 20% or more of a dielectric loss material. When a width of a groove is narrowed to suppress a radio wave propagation amount, a loss of the microstrip line increases as a side effect as illustrated in FIGS. 3 and 4. In this example, a choke structure to narrow a cross-sectional area locally disposed in a groove structure is provided although a width of the groove structure is equal to or less than a wavelength $\lambda$ of a use frequency so as to enhance a radio wave suppression effect in the groove structure itself while mitigating influence on the microstrip line.

Third Embodiment

Figure 6:
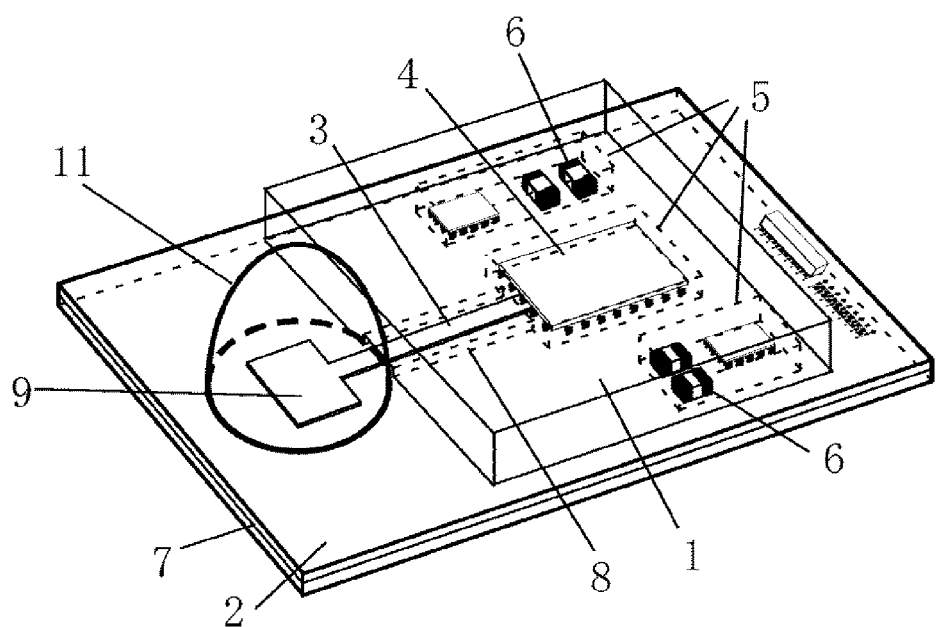
FIG. 6 is a perspective view of a millimeter-wave band communication device according to a third embodiment of the present invention.

FIG. 6 is a perspective view of a millimeter-wave band communication device according to a third embodiment of the present invention. Here, 1 represents a cover, 2 represents a circuit board, 3 represents a microstrip line, 4 represents a millimeter-wave band radio frequency circuit, 5 represents a cover concave portion, 6 represents a passive element, 7 represents an interlayer conductor, 8 represents a groove structure of the cover, 9 represents an antenna, and 11 represents a dielectric lens (lens antenna).

The dielectric lens 11 is connected to the antenna 9 provided on the circuit board 2 in order to enhance the radiation directivity of the antenna 9. The dielectric lens 11 is an insulator, and collects radio waves on a lens curved surface to narrow an angle. Although both the cover and the lens are not formed using a single material since the insulator made of a different material from the cover having favorable radio wave transmission characteristics is adopted, it is possible to integrate both the cover and the lens by using a two-color molding method or a mixed color forming method in which a plurality of materials is molded with one mold. When only the portion of the dielectric lens 11 through which the radio waves transmitted to be collected is formed using the material for the lens antenna and a periphery of the lens is held and fixed using a material on the cover 1 side, it is possible to eliminate a gap between the cover 1 and the dielectric lens 11 and to cause the radio waves radiated from the antenna 9 to be efficiently propagated without leaking to the outside of the lens.

Fourth Embodiment

Figure 7:
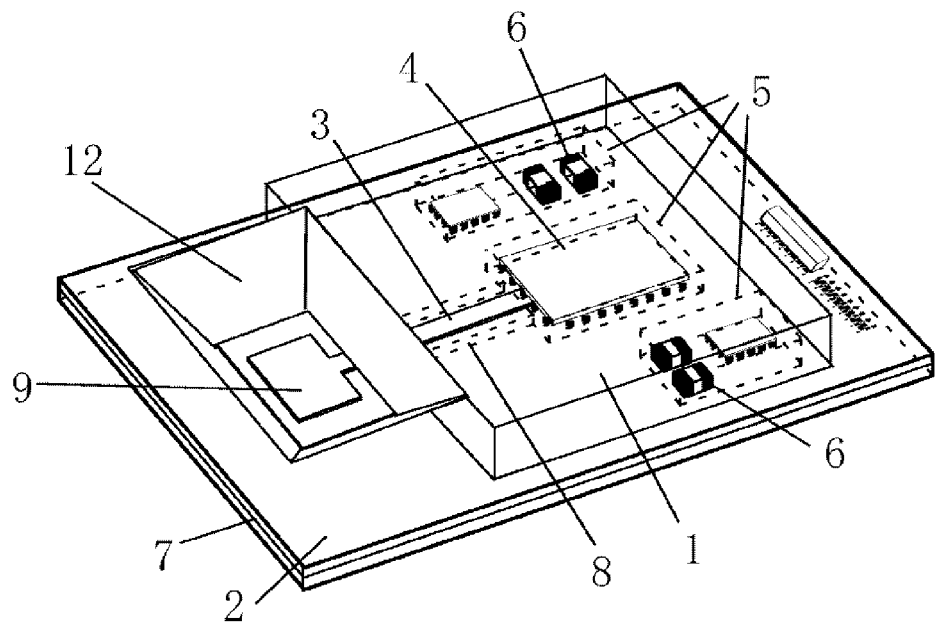
FIG. 7 is a perspective view of a millimeter-wave band communication device according to a fourth embodiment of the present invention.

FIG. 7 is a perspective view of a millimeter-wave band communication device according to a fourth embodiment of the present invention. Here, 1 represents a cover, 2 represents a circuit board, 3 represents a microstrip line, 4 represents a millimeter-wave band radio frequency circuit, 5 represents a cover concave portion, 6 represents a passive element, 7 represents an interlayer conductor, 8 represents a groove structure of the cover, 9 represents an antenna, and 12 represents a waveguide horn antenna.

The horn antenna 12 is connected to the antenna 9 provided on the circuit board 2 in order to enhance the radiation directivity of the antenna 9. The horn antenna 12 can be processed using a resin compounded with a dielectric loss material at a high ratio, which is similar to the cover 1. The horn antenna 12 and the cover 1 can be integrated to simplify holding and fixing of the horn antenna, which is similar to the lens antenna of the third embodiment. A resin whose graphite compounding ratio exceeds 80% by mass so as to suppress attenuation caused by multiple reflections on an inner surface of the horn antenna may be produced by a two-color molding method similarly as in the lens antenna.

Fifth Embodiment

Figure 8:
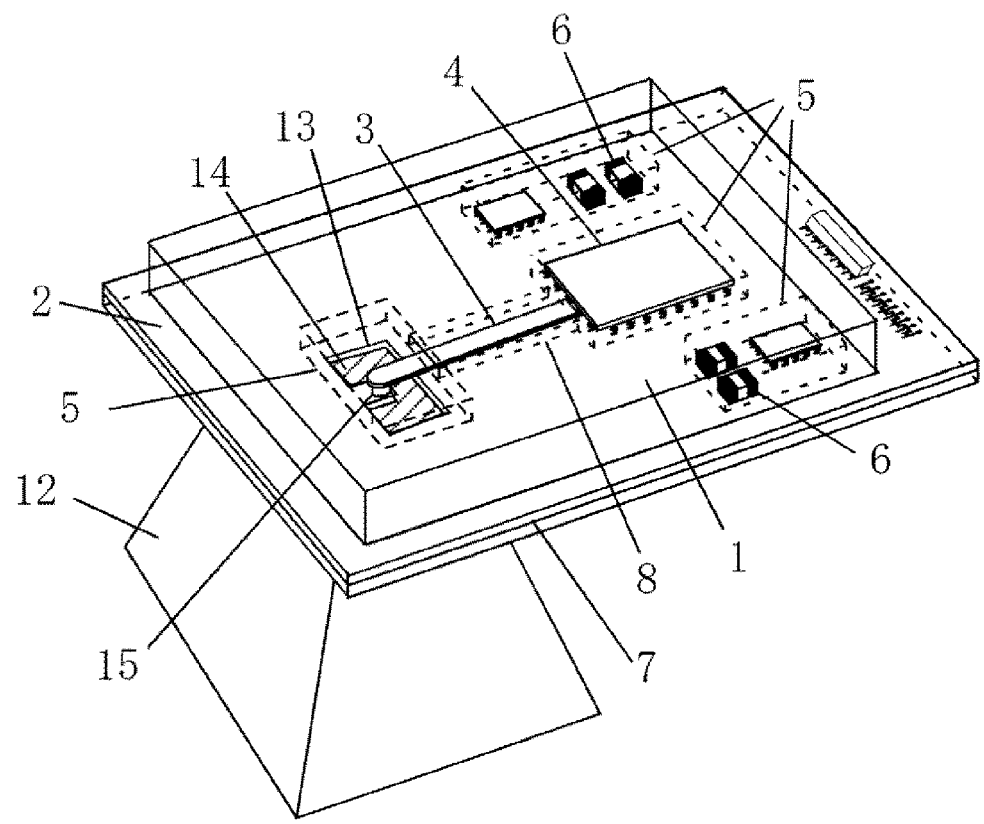
FIG. 8 is a perspective view of a millimeter-wave band communication device according to a fifth embodiment of the present invention.

FIG. 8 is a transparent perspective view of a millimeter-wave band communication device according to a fifth embodiment of the present invention. Here, 1 represents a cover, 2 represents a circuit board, 3 represents a microstrip line, 4 represents a millimeter-wave band radio frequency circuit, 5 represents a cover concave portion, 6 represents a passive element, 7 represents an interlayer conductor, 8 represents a groove structure of the cover, 12 represents a horn antenna, 13 represents a slit, 14 represents a slot, and 15 represents a via. The microstrip line 3, the slit 13, and the slot 14 are formed on the circuit board 2, and the microstrip line 3 uses the interlayer conductor 7 as a GND conductor, but the slit 13 is provided in the interlayer conductor 7 of the GND conductor.

A millimeter wave signal transmitted from the millimeter-wave band radio frequency circuit 4 is propagated to the horn antenna 12 on the opposite side of the circuit board 2 via the microstrip line 3, the slit 13, and the slot 14. When a millimeter wave is propagated from the microstrip line 3 to the slit 13, the microstrip line is connected to the slit through a via 15, but the microstrip line from which a GND conductor is hollowed out by the via 15 and the slit 13 is inductive and has a structure where radio waves are easily radiated and leaked. The concave portion 5 of the cover 1 is provided in a line conversion portion between the microstrip line and the slit. The concave portion 5 of the cover 1 covers the line conversion portion, thereby reducing the radiation leakage.

Sixth Embodiment

Figure 9:
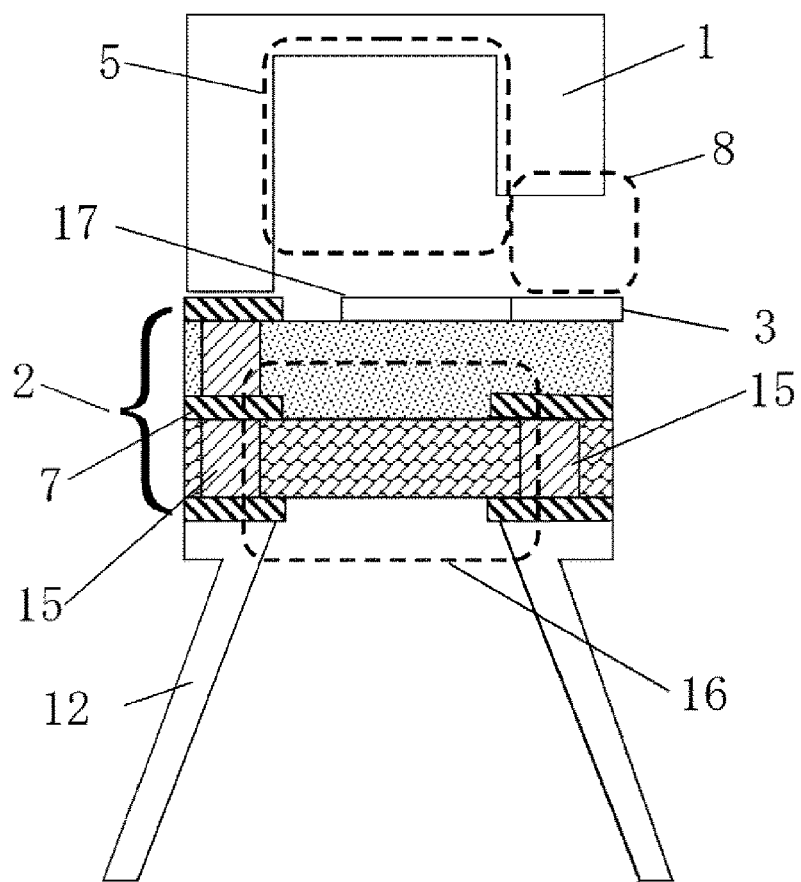
FIG. 9 is a cross-sectional view of a millimeter-wave band communication device according to a sixth embodiment of the present invention.

FIG. 9 is a cross-sectional view of a millimeter-wave band communication device according to a sixth embodiment of the present invention. Here, 1 represents a cover, 2 represents a circuit board, 3 represents a microstrip line, 5 represents a cover concave portion, 7 represents an interlayer conductor, 8 represents a groove structure of the cover, 12 represents a horn antenna, 16 represents a waveguide structure imitating the inside of the circuit board, and 17 represents a stub line with a length of $\lambda/4$. The microstrip line 3 is connected to the stub line 17 disposed on an upper part of the waveguide structure 16. A groove having a depth of $\lambda/4$ is formed in the cover concave portion 5 disposed in the waveguide structure 16 and the stub line 17. The cover concave portion 5 serves as a waveguide back short of $\lambda/4$ such that line conversion is performed efficiently from the microstrip line 3 to the waveguide structure 16 via the stub line 17.

As described above in detail, the cover 1 compounded with the dielectric loss material at a high ratio is made of the material having the reflection loss characteristic while suppressing the radio wave transmission characteristic in the first to sixth embodiments. As the millimeter-wave band radio frequency circuit 4 provided in the circuit board 2 is accommodated in the cover concave portion 5, the unnecessary radio waves from the outside are suppressed by the radio wave transmission characteristic of the cover 1. The unnecessary radio waves having been reflected and invaded the gap between the cover 1 and the circuit board 2 are attenuated and removed by the multiple reflections between the circuit board 2 and the cover 1. The isolation between the cover concave portions 5 covering the millimeter-wave band radio frequency circuit 4 is the radio wave transmission characteristic of the cover 1 itself, and the radio waves radiated and leaked from the millimeter-wave band radio frequency circuit 4 itself are attenuated and removed by the multiple reflections due to the internal reflection of the cover concave portion 5.

Signal transmission to the antenna 9 and the outside is connected via a line provided inside the groove 8 of the cover 1. Although radio wave propagation is possible directly with the groove structure of the cover 1, it is possible to suppress the radio wave propagation by increasing the multiple-reflection attenuation in the groove space by restricting the width of the groove 8 to A or less, and it is possible to obtain sufficient isolation between the circuits.

In addition, the balance between the transmission characteristic and the reflection characteristic is adjusted by selecting the compounding ratio of the dielectric loss material in the resin, and the increase or decrease of the transmission characteristic is controlled by the thickness of the cover. It is not necessary to electrically connect the cover and the GND of the circuit board since the electromagnetic wave is suppressed using the multiple-reflection attenuation between the cover and the circuit board, which is different from the shield effect of the metal cover. Therefore, it suffices that the cover 1 is physically in contact with the circuit board 2, and the cover 1 can be easily assembled by screwing or pinning, or using an insulating adhesive or the like, and mounting cost is realized at extremely low cost as compared with the metal cover.

The present invention is not limited to the above-described embodiments, and includes various modification examples. For example, some configurations of a certain embodiment can be substituted by configurations of another embodiment, and further, a configuration of another embodiment can be added to a configuration of a certain embodiment. Further, addition, deletion or substitution of configurations of the respective embodiments can be made with respect to some configurations of each embodiment.

INDUSTRIAL APPLICABILITY

The present invention can be applied to a communication device and a sensor device which utilize a millimeter wave electromagnetic wave.

REFERENCE SIGNS LIST 1 cover
2 circuit board
3 radio frequency line (microstrip line)
4 millimeter-wave band radio frequency circuit
5 cover concave portion
6 passive element
7 interlayer conductor
8 groove structure
8-2 choke structure-equipped groove structure
9 antenna
10 millimeter-wave band communication device
11 dielectric lens
12 horn antenna
13 slit
14 slot
15 via
16 waveguide structure
17 stub line

The invention claimed is:

1. A millimeter-wave band communication device comprising:
    a substrate;
    a radio frequency circuit element for a millimeter-wave band provided on the substrate; and
    a non-metallic cover made of a bulk material that covers at least a part of the radio frequency circuit element and a surface of the substrate,
    wherein the cover is formed by blending a dielectric loss material in a base material.

2. The millimeter-wave band communication device according to claim 1, wherein
    the dielectric loss material is graphite.

3. The millimeter-wave band communication device according to claim 1, wherein
    a radio wave reflection efficiency of the cover is set to 90% or less.

4. The millimeter-wave band communication device according to claim 1, wherein
    a radio wave reflection efficiency of the cover is set to between 50% and 90%.

5. The millimeter-wave band communication device according to claim 1, wherein
    the cover is integrally molded using a resin as the base material.

6. The millimeter-wave band communication device according to claim 1, wherein
    a compounding ratio of the dielectric loss material compounded with the cover is between 20% and 80% of an entirety of the cover or in an average mass ratio.

7. The millimeter-wave band communication device according to claim 1, wherein
    the cover has a volume resistivity of 20 Ω·cm or higher.

8. The millimeter-wave band communication device according to claim 1, wherein
    a compounding concentration of the dielectric loss material is lower on a side of the cover opposing the substrate.

9. The millimeter-wave band communication device according to claim 1, wherein
    a compounding concentration of the dielectric loss material is higher on a side closer to a thickness center of the cover.

10. The millimeter-wave band communication device according to claim 1, wherein
    the cover is a rectangular parallelepiped, has a thickness T in a direction perpendicular to the substrate, has a concave portion so as to cover the radio frequency circuit element, and a distance D between a ceiling of the concave portion of the cover and the substrate is smaller than the thickness T and larger than a height H of the radio frequency circuit element.

11. The millimeter-wave band communication device according to claim 1, further comprising:
   a radio frequency line provided on the substrate surface and connected to the radio frequency circuit element; and
   a groove structure formed in the cover so as to prevent contact between the radio frequency line and the cover.

12. The millimeter-wave band communication device according to claim 11, wherein
   a width of the groove structure at a cross section intersecting with a radio wave propagation direction of the radio frequency line is set to be equal to or less than a wavelength $\lambda$ of a millimeter wave use frequency.

13. The millimeter-wave band communication device according to claim 11, further comprising:
   an antenna provided on a side of the radio frequency line opposite to the radio frequency circuit element; and
   a dielectric lens made of an insulator,
   wherein the cover and the dielectric lens are integrally formed.

14. The millimeter-wave band communication device according to claim 11, wherein
   an antenna provided on a side of the radio frequency line opposite to the radio frequency circuit element; and
   a horn antenna configured by compounding a resin with a dielectric loss material,
   wherein the cover and the horn antenna are integrally configured.

15. The millimeter-wave band communication device according to claim 14, wherein
   the concave portion of the cover is set to have a depth of $\lambda/4$ so as to function as a back short of a line converter of the radio frequency line.

16. The millimeter-wave band communication device according to claim 1, wherein the cover does not include an outer metal layer and is not metal plated.

* * * * *